US010835912B2

(12) United States Patent
Orita et al.

(10) Patent No.: US 10,835,912 B2
(45) Date of Patent: Nov. 17, 2020

(54) DETECTOR AND SPRAYING DEVICE PROVIDED WITH SAID DETECTOR

(71) Applicant: SUMITOMO CHEMICAL COMPANY, LIMITED, Tokyo (JP)

(72) Inventors: Tuyoshi Orita, Takarazuka (JP); Takahiro Okuie, Takarazuka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 41 days.

(21) Appl. No.: 15/771,942

(22) PCT Filed: Nov. 2, 2016

(86) PCT No.: PCT/JP2016/082679
§ 371 (c)(1),
(2) Date: Apr. 27, 2018

(87) PCT Pub. No.: WO2017/078101
PCT Pub. Date: May 11, 2017

(65) Prior Publication Data
US 2018/0333731 A1 Nov. 22, 2018

(30) Foreign Application Priority Data
Nov. 4, 2015 (JP) .................................. 2015-216606

(51) Int. Cl.
*B05B 12/02* (2006.01)
*G01J 5/00* (2006.01)
(Continued)

(52) U.S. Cl.
CPC .............. *B05B 12/02* (2013.01); *B05B 12/08* (2013.01); *B05B 12/122* (2013.01); *G01J 1/06* (2013.01);
(Continued)

(58) Field of Classification Search
CPC ........ B05B 12/02; B05B 12/08; G01J 5/0025; G01J 5/0893; G01J 5/0831; B65D 83/267; B65D 83/262
See application file for complete search history.

(56) References Cited

U.S. PATENT DOCUMENTS 3,415,994 A * 12/1968 Fitti, Jr. ................ G01J 5/0831
250/349
6,369,688 B1 4/2002 Abe et al.
(Continued)

FOREIGN PATENT DOCUMENTS

CN 1475764 A 2/2004
CN 201238548 Y 5/2009
(Continued)

OTHER PUBLICATIONS

International Preliminary Report on Patentability and Written Opinion of the International Searching Authority (Forms PCT/IB/338, PCT/IB/326, PCT/IB/373 and PCT/ISA/237) for Application No. PCT/JP2016/082680, dated May 17, 2018, with English translation.
(Continued)

*Primary Examiner* — Tuongminh N Pham
(74) *Attorney, Agent, or Firm* — Birch, Stewart, Kolasch & Birch, LLP

(57) ABSTRACT

A detection device includes: a detector having an inherent detection area to detect entry of a detection target into the inherent detection area; a restrictor for restricting the inherent detection area to a specific set detection area; a body having a detector opening part; a detector fixer for fixing the detector; and a restrictor fixer whose position is fixed to the detector fixer and to which the restrictor is fixed, the restrictor fixer configured so that a relative position between the detector and the restrictor is fixed by fixing a position of the restrictor to the detector fixer via the restrictor fixer. The detector and the restrictor whose positions are thus fixed are
(Continued)

assembled to the body so that a circumferential edge of the detector opening part is located outside the set detection area while the restriction of the inherent detection area by the restrictor is maintained.

5 Claims, 14 Drawing Sheets

(51) Int. Cl.
*H03K 17/945* (2006.01)
*H01H 35/00* (2006.01)
*G01J 1/06* (2006.01)
*G01V 8/12* (2006.01)
*B05B 12/12* (2006.01)
*G01J 5/04* (2006.01)
*G01J 5/08* (2006.01)
*B05B 12/08* (2006.01)

(52) U.S. Cl.
CPC ............... *G01J 5/0025* (2013.01); *G01J 5/04* (2013.01); *G01J 5/089* (2013.01); *G01J 5/0831* (2013.01); *G01V 8/12* (2013.01); *H01H 35/00* (2013.01); *H03K 17/945* (2013.01)

(56) References Cited

U.S. PATENT DOCUMENTS

| 6,755,031 | B2 | 6/2004 | Cho et al. |
| 7,893,829 | B2 | 2/2011 | Sipinski et al. |
| 9,598,846 | B2 | 3/2017 | Shirai et al. |
| 2004/0031274 | A1* | 2/2004 | Cho .................. G01J 5/084 62/126 |
| 2009/0309717 | A1 | 12/2009 | Sipinski et al. |
| 2010/0193599 | A1 | 8/2010 | Butler et al. |
| 2010/0243673 | A1 | 9/2010 | Furner et al. |
| 2010/0288627 | A1 | 11/2010 | Tanida et al. |
| 2011/0295434 | A1 | 12/2011 | Luc et al. |
| 2012/0283884 | A1 | 11/2012 | Luc et al. |
| 2013/0068783 | A1* | 3/2013 | Gasper ................ A01M 1/2038 222/1 |
| 2014/0014685 | A1 | 1/2014 | Luc et al. |
| 2014/0103479 | A1* | 4/2014 | Luc ..................... A61L 9/12 257/435 |
| 2015/0259890 | A1 | 9/2015 | Shirai et al. |
| 2016/0201306 | A1 | 7/2016 | Shirai et al. |

FOREIGN PATENT DOCUMENTS

| CN | 101910737 A | 12/2010 |
| CN | 102587476 A | 7/2012 |
| CN | 103096941 A | 5/2013 |
| CN | 103676959 A | 3/2014 |
| JP | 2-9891 U | 1/1990 |
| JP | 6-3366 A | 1/1994 |
| JP | 6-79204 A | 3/1994 |
| JP | 6-170286 A | 6/1994 |
| JP | 08-261835 A | 10/1996 |
| JP | 9-138284 A | 5/1997 |
| JP | 2852582 B2 | 2/1999 |
| JP | 2000-357443 A | 12/2000 |
| JP | 2004-077462 A | 3/2004 |
| JP | 2010-167187 A | 8/2010 |
| JP | 2011-027645 A | 2/2011 |
| JP | 2012-145545 A | 8/2012 |
| JP | 2014-123982 A | 7/2014 |
| JP | 2015-68120 A | 4/2015 |

OTHER PUBLICATIONS

International Search Report and English translation (Form PCT/ISA/210) for Application No. PCT/JP2016/082680, dated Jan. 17, 2017.
International Preliminary Report on Patentability issued in corresponding International Application No. PCT/JP2016/082679 dated May 17, 2018, with English language translation.
International Search Report for PCT/JP2016/082679 (PCT/ISA/210) dated Jan. 24, 2017.
Chinese Office Action for Chinese Application No. 201680062601.2, dated Jun. 5, 2019.
United States Notice of Allowance for U.S. Appl. No. 15/771,970, dated Aug. 21, 2019.
Australian Examination Report No. 1, dated Jul. 1, 2020, for Australian Application No. 2016350486.
Chinese Office Action and Search Report, dated Jun. 16, 2020, for Chinese Application No. 201680062613.5.

* cited by examiner

DETECTOR AND SPRAYING DEVICE PROVIDED WITH SAID DETECTOR

CROSS-REFERENCE TO RELATED APPLICATION

This application claims priority to Japanese Patent Application No. 2015-216606, filed on Nov. 4, 2015, the disclosure of which is incorporated herein by reference in its entirety.

FIELD

The present invention relates to a detection device configured to detect entry of a detection target into a detection area and a spray device provided with the detection device.

BACKGROUND

Conventionally, there are heat ray sensor-equipped automatic switches configured to detect heat rays emitted from human bodies and control ON/OFF of load (such as lighting load) (for example, Patent Literature 1).

Some of the heat ray sensor-equipped automatic switches of this type include a human body detection sensor 101 configured to detect heat rays emitted from human bodies, a cover 103 in which a sensor window 102 facing a light receiving surface of the human body detection sensor 101 is formed, and a pair of area limiting covers 104 arranged between the human body detection sensor 101 and the cover 103 and configured to restrict a heat ray detection area, for example, as shown in FIG. 14.

In such a heat ray sensor-equipped automatic switch 100 according to Patent Literature 1, the pair of area limiting covers 104 are configured to be slidable against the inner circumferential surface of the cover 103 and are capable of restricting the detection area of the human body detection sensor 101 by sliding against the cover 103.

Specifically, each of the pair of area limiting covers 104 is a plate member curved from one end 104a to the other end 104b and is sandwiched between the inner circumferential surface of the cover 103 and the outer circumferential surface of a cover support frame 106 covered by the cover 103, while being deflected in a direction in which the one end 104a and the other end 104b get away from each other (see the arrows in FIG. 14). Each of the pair of area limiting covers 104 has a projection 107 configured to be locked with a groove (not shown) formed on the inner circumferential surface of the cover 103 and a projection 109 configured to be locked with a groove 108 formed on the outer circumferential surface of the cover support frame 106. The pair of area limiting covers 104 are configured to restrict the detection area by sliding against the cover 103 and the cover support frame 106 and stopping at specific positions. In this way, the heat ray sensor-equipped automatic switch 100 according to Patent Literature 1 can narrow the detection area in order to block unnecessary heat rays or widen the detection area in order to detect heat rays in a wide range.

CITATION LIST

Patent Literature

Patent Literature 1: JP 2000-357443 A

Since the pair of area limiting covers 104 are arranged between the cover 103 and the cover support frame 106 while being deflected, the deflection amount varies depending on the size of the gap between the cover 103 and the cover support frame 106. When the deflection amount of the pair of area limiting covers 104 varies, the length from the one end 104a to the other end 104b also varies.

Specifically, the narrower the gap between the cover 103 and the cover support frame 106, the larger the deflection amount of the pair of area limiting covers 104. Therefore, the one end 104a and the other end 104b of each area limiting cover 104 are farther from each other. That is, as the deflection amount of each area limiting cover 104 increases, the linear distance from the one end 104a to the other end 104b increases, and therefore the spacing between the pair of area limiting covers 104 from each other is narrowed when the pair of area limiting covers 104 are immobile relative to the cover 103 and the cover support frame 106.

In contrast, as the gap between the cover 103 and the cover support frame 106 increases, the deflection amount of the pair of area limiting covers 104 decreases, and thus the one end 104a and the other end 104b of each area limiting cover 104 get closer to each other. That is, when the deflection amount of each area limiting cover 104 is small, the linear distance from the one end 104a to the other end 104b is short, and therefore when the pair of area limiting covers 104 are immobile relative to the cover 103 and the cover support frame 106, the spacing between the pair of area limiting covers 104 is wide.

In this way, even if the pair of area limiting covers 104 remain immobile relative to the cover 103 and the cover support frame 106 at the same positions, the spacing between the pair of area limiting covers 104 varies depending on the size of the gap between the cover 103 and the cover support frame 106. As a result, the range of the detection area differs between the case where the gap is wide and the case where the gap is narrow. Therefore, the margin of error in assembling the cover 103 and the cover support frame 106 causes variation in the detection area depending on the product of the heat ray sensor-equipped automatic switch 100 according to Patent Literature 1, which results in poor accuracy.

As described above, the conventional heat ray sensor-equipped automatic switch 100 has a problem in which it cannot accurately set the detection area, which causes a widened or narrowed detection area (the detection area varies) depending on the product, and consequently fails to achieve high detection accuracy.

SUMMARY

Technical Problem

In view of such an actual situation, it is an object of the present invention to provide a detection device capable of performing detection with high accuracy (without variation) by accurately setting a detection area and a spray device including the detection device.

Solution to Problem

A detection device according to the present invention includes: a detector having an inherent detection area and configured to detect entry of a detection target into the inherent detection area; a restrictor configured to restrict the inherent detection area to a specific set detection area; a body in which a detector opening part is formed; a detector fixer configured to fix the detector; and a restrictor fixer of which a position is fixed with respect to the detector fixer and to which the restrictor is fixed, the restrictor fixer being configured so that a relative position between the detector and the restrictor is fixed by fixing a position of the restrictor with respect to the detector fixer via the restrictor fixer, wherein the detector and the restrictor of which the positions are fixed with respect to each other via the restrictor fixer are assembled to the body so that a circumferential edge of the detector opening part of the body is located outside the set detection area while the restriction of the inherent detection area by the restrictor is maintained.

According to one aspect of the present invention, the restrictor fixer may be provided in at least one of the detector and the detector fixer.

According to another aspect of the present invention, the restrictor may have an area restrictor configured to lead the set detection area out of the inherent detection area to the detector opening part of the body; and an area blocker configured to block the inherent detection area other than the set detection area from the body.

In this case, the area restrictor may have a restrictor opening that is open in the inherent detection area to be smaller than the inherent detection area.

Further, in this case, the area restrictor may be a lens arranged in the inherent detection area and configured to restrict the inherent detection area.

According to another aspect of the present invention, the detector may be a pyroelectric sensor.

A spray device according to the present invention is configured to spray a spray material at a specific time interval, the spray device including: a controller configured to control a spraying operation; a storage configured to store the spray material; a spray configured to spray the spray material; and the detection device described above, wherein the controller performs control so that spraying is stopped when the detection device detects a detection target.

DESCRIPTION OF EMBODIMENTS

Figure 1:
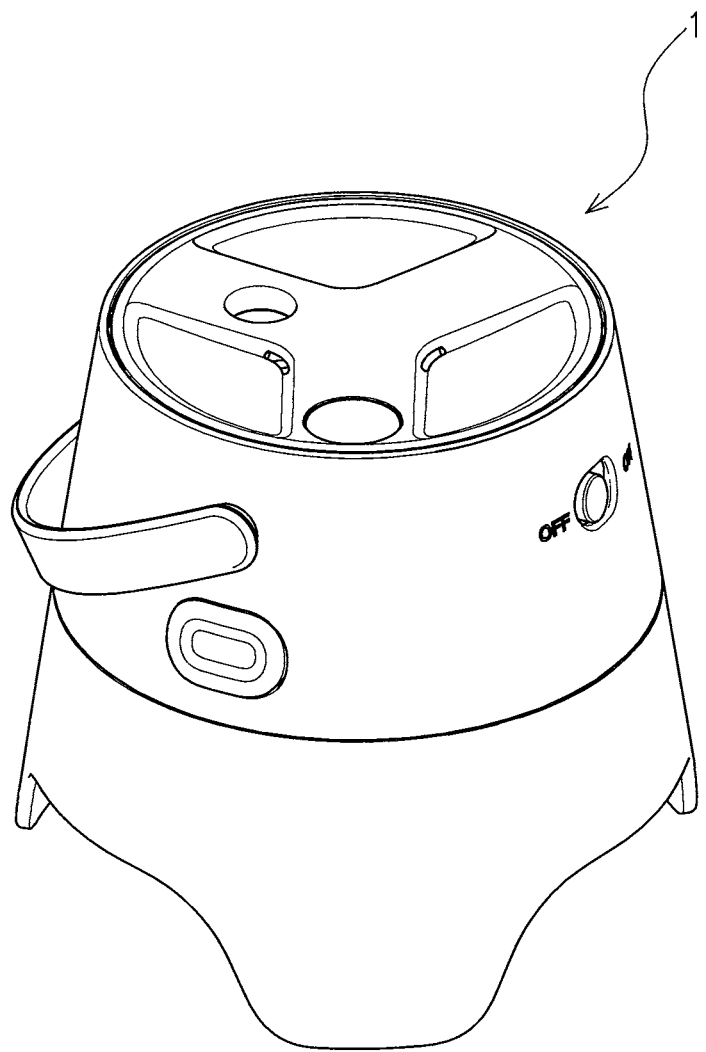
FIG. 1 is a perspective view of a spray device according to an embodiment of the present invention.
Figure 2:
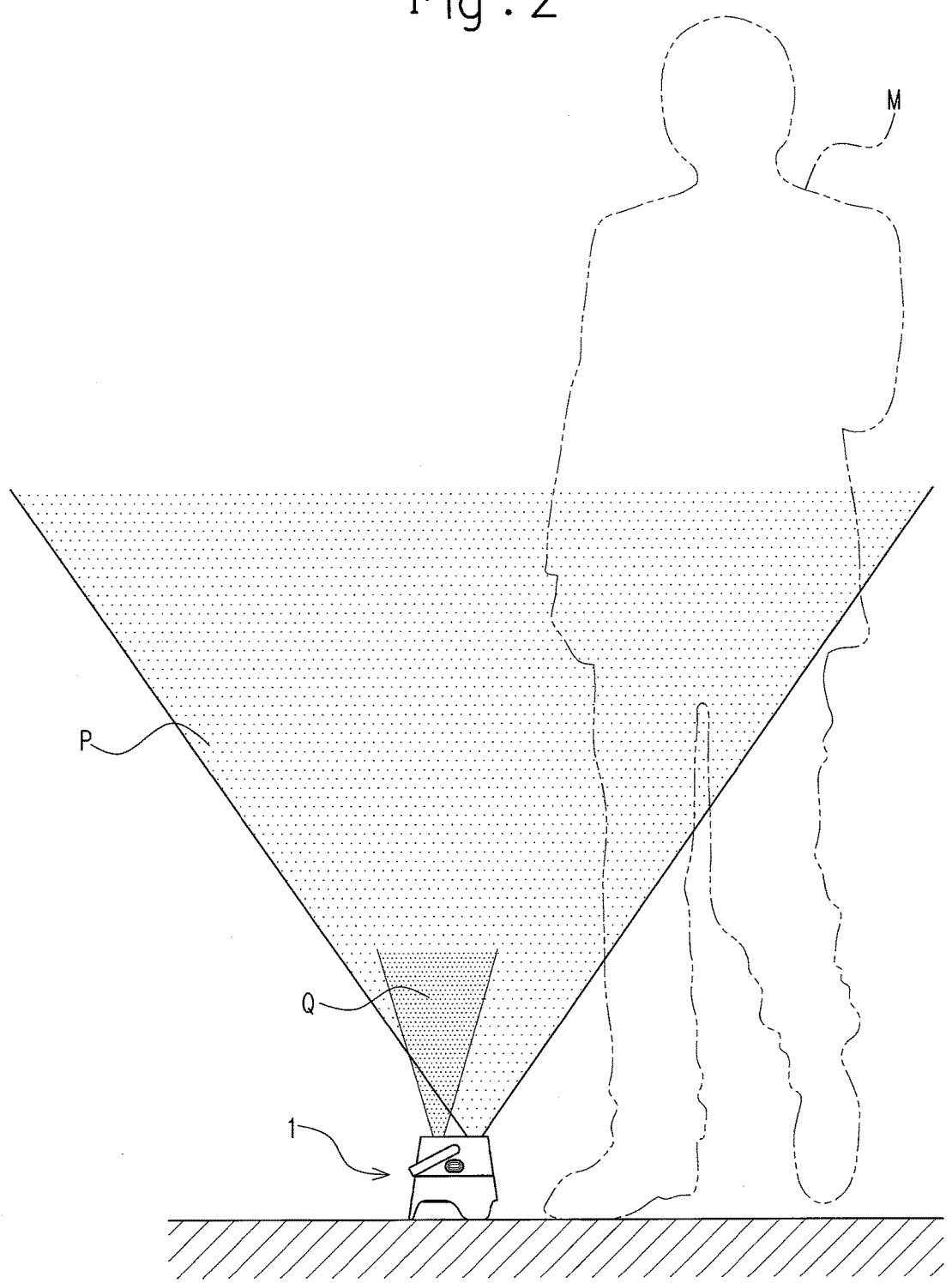
FIG. 2 is a view for schematically explaining how a spray area and a set detection area of the spray device according to the aforementioned embodiment expand.
Figure 3:
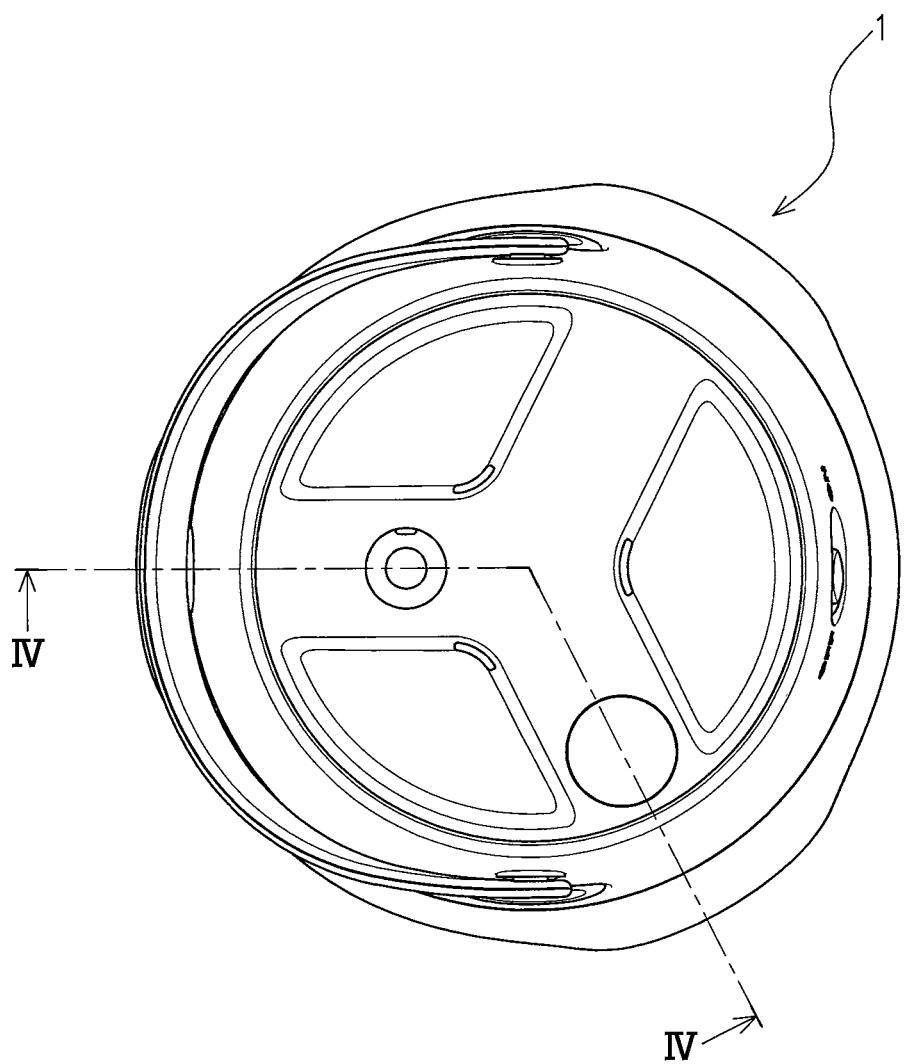
FIG. 3 is a plan view of the spray device according to the aforementioned embodiment.

Hereinafter, a spray device according to an embodiment of the present invention is described with reference to the drawings.

The spray device is controlled to spray a spray material at a specific time interval. As shown in FIG. 1 to FIG. 5, a spray device 1 includes a controller (not shown) configured to control a spraying operation, a storage 2 configured to store the spray material, a spray 3 configured to spray the spray material, a detection device 4 configured to detect a detection target M, a power supply 6 as a power source of the spray 3 and the detection device 4, and a spray body 5 housing the controller, the storage 2, the spray 3, the detection device 4, and the power supply 6. The spray device 1 is controlled to stop spraying when the detection device 4 detects the detection target M.

The spray material is a material to be sprayed from the spray 3 and is intended to be a material such as a particulate material or a material having fluidity such as gases and liquids. In the spray device 1 of this embodiment, a liquid drug having an insecticidal effect is used as the spray material.

In this embodiment, the spray device 1 is controlled to perform spraying for 0.1 second to 2 seconds every 30 seconds. The spray device 1 of this embodiment is controlled so that the spray material spreads over a spray area Q formed to have a spray height of about 10 cm to 40 cm and a spray angle of about 10 degrees to 20 degrees. The spray device 1 is controlled so that a set detection area P expands to have a detection distance (detection height) of about 90 cm and a detection angle of about 70 degrees. The set detection area P is set larger than the spray area Q.

Figure 4:
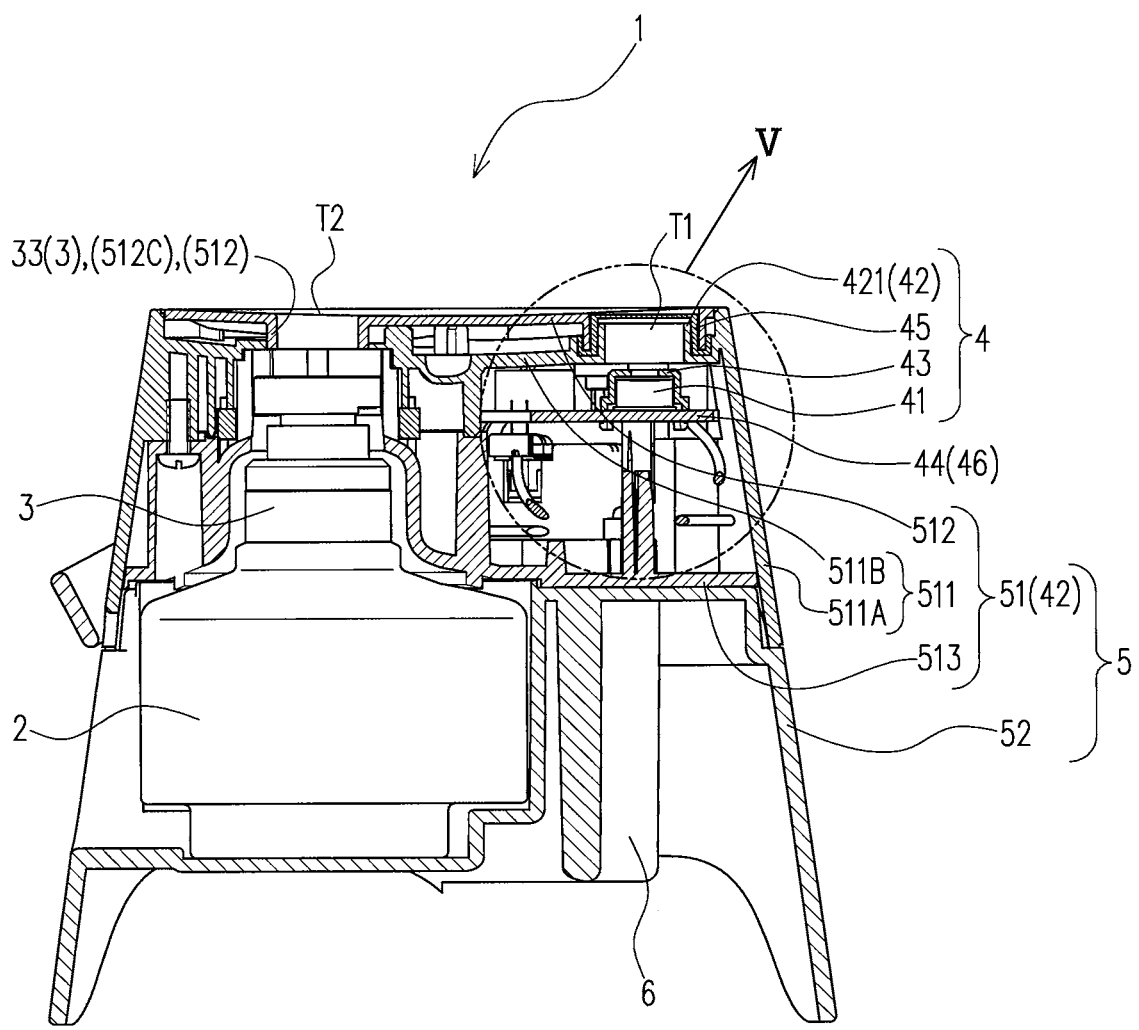
FIG. 4 is a sectional view of the spray device taken along line IV-IV in FIG. 3.

As shown in FIG. 4, the storage 2 is connected to the spray 3 so as to be capable of feeding the spray material to the spray 3. The storage 2 of this embodiment is a bottomed cylindrical container.

The spray 3 has a spray opening 33 through which the spray material is sprayed. The spray opening 33 is open so as to spray the spray material upward. The spray opening 33 has a circular shape. The spray opening 33 is formed in a covering 512 of a cover 51, which will be described below. The spray opening 33 is open in an intermediate part between the end edge and the center of the covering 512.

The detection device 4 includes a detector 41 having an inherent detection area R that is an inherently provided detection area, a restrictor 43 configured to restrict the inherent detection area R to a specific set detection area P, a body 42 in which a detector opening part 421 is formed that is open with its circumferential edge located outside the set detection area P (so as to lead the set detection area P to the outside of the detection device 4 without interference with the set detection area P), and a closer 45 capable of closing the detector opening part 421. The inherent detection area R is a detection area that is originally provided in the detector 41. That is, the inherent detection area R is a detection area formed to have a certain size around the detector 41 unless it is blocked by a specific blocker.

The detector 41 detects entry of the detection target M into the inherent detection area R. The detector 41 has the inherent detection area R radially expanding in a specific direction (see FIG. 6 to FIG. 9). The detector 41 of this embodiment is arranged in the spray body 5 so that the inherent detection area R expands upward. The detector 41 of this embodiment is a pyroelectric sensor. That is, the detector 41 is configured to detect the detection target M based on fluctuations in output voltage of a pyroelectric element C caused by receiving infrared rays emitted from the detection target M.

Figure 5:
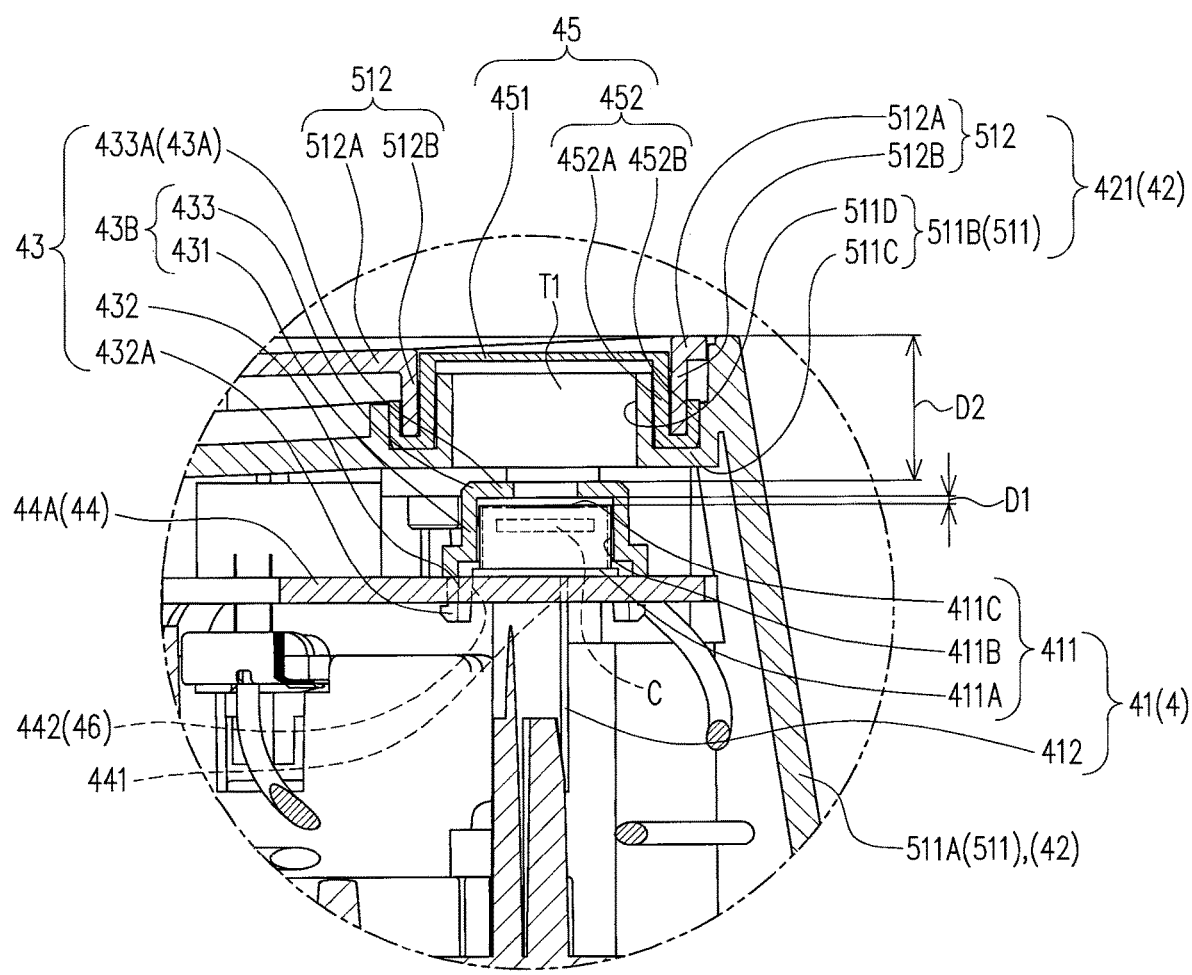
FIG. 5 is an enlarged view of part V in FIG. 4, showing the periphery of a detection device of the spray device according to the aforementioned embodiment.

As shown in FIG. 5, the detector 41 is fixed to a detector fixer 44 configured to fix the detector 41. The detector 41 is assembled to the body 42 in the state of being fixed to the detector fixer 44. The detector 41 has a detector body 411 inside which the pyroelectric element C is arranged, and a terminal 412 extending from the inside of the detector body 411 to the outside of the detector body 411. In this embodiment, the detector 41 is fixed to the detector fixer 44 in the state where the terminal 412 passes through the detector fixer 44, and the detector body 411 is mounted on the detector fixer 44.

The detector body 411 has a mount 411A on which the pyroelectric element C is mounted, and a detector cover 411B in which a window 411C facing a light receiving surface of the pyroelectric element C is formed. The detector body 411 forms the inherent detection area R determined by the size of the light receiving surface of the pyroelectric element C faced by the window 411C. The detector cover 411B is formed into a cylindrical shape, with one end open and the other end closed. The detector cover 411B is arranged on the mount 411A by positioning the one end on the mount 411A that is formed into a circular plate shape. The window 411C is formed at the other end of the detector cover 411B. The window 411C of this embodiment has a rectangular shape. The detector body 411 is fixed to the detector fixer 44 so that the window 411C is located on the upper side.

The terminal 412 extends from the one end of the detector body 411 outwardly of the detector body 411. The terminal 412 of this embodiment is constituted by three lead terminals and extends in the same direction (downward) as the direction in which the center line of the detector body 411 extends. The terminal 412 is connected to a specific circuit (not shown).

The detector fixer 44 fixes the detector 41. In this embodiment, the detector fixer 44 is a substrate 44A and fixes the detector 41 and the restrictor 43. The substrate 44A has a terminal receptor 441 through which the terminal 412 of the detector 41 is inserted, and leg receptors 442 through which restrictor legs 432, which will be described below, of the restrictor 43 are inserted. The substrate 44A is fixed to the inside of the spray body 5 so as to be horizontal to the mounting surface, in the state where the detector body 411 of the detector 41, and a side wall 431 and an end wall 433, which will be described below, of the restrictor 43 are located thereabove (mounted thereon).

The leg receptors 442 pass through the substrate 44A in the thickness direction and are configured so that the restrictor legs 432 of the restrictor 43 can be inserted therethrough. In this embodiment, three leg receptors 442 are provided at positions overlapping an opening area T1 of the detector opening part 421 in the vertical direction so that the leg receptors 442 adjacent to one another are at equal intervals.

The restrictor 43 restricts the inherent detection area R to the specific set detection area P. The restrictor 43 is fixed to a restrictor fixer 46, a position of is fixed with respect to the detector fixer 44 (in this embodiment, the substrate 44A), in the state of being arranged between the detector 41 and the body 42 so as to restrict the inherent detection area R to the set detection area P. That is, the position of the restrictor 43 is fixed with respect to the detector 41 in the state of being assembled to the body 42 so that the set detection area P is set to a specific range.

The restrictor fixer 46 is provided in at least one of the detector 41 and the detector fixer 44. In this embodiment, the restrictor fixer 46 is provided in the substrate 44A. The position of the restrictor fixer 46 is fixed with respect to the substrate 44A by being formed integrally with the substrate 44A. Specifically, the restrictor fixer 46 is constituted by the leg receptors 442 of the substrate 44A.

The restrictor 43 has the cylindrical side wall 431, the restrictor legs 432 located on one end side of the side wall 431 and configured to be engaged with the substrate 44A, and the end wall 433 having a plate shape located on the other end side of the side wall 431 and expanding radially inwardly of the side wall 431 from the other end side. The restrictor 43 is fixed to the substrate 44A by inserting the restrictor legs 432 through the leg receptors 442 of the substrate 44A and engaging the restrictor legs 432 with the leg receptors 442. The restrictor 43 is fixed to the substrate 44A so that the set detection area P is located inside the circumferential edge of the detector opening part 421.

The restrictor legs 432 are plate pieces extending from one end side of the side wall 431. The restrictor legs 432 have claws 432A projecting radially outwardly from their tips. The claws 432A are engaged with the end edges of the respective leg receptors 442, thereby preventing the restrictor 43 from falling out or being pulled out of the substrate 44A. Further, the restrictor legs 432 are configured so that the outer circumferential surfaces of the restrictor legs 432 substantially contact the inner circumferential surfaces of the leg receptors 442, when being inserted through the leg receptors 442, so as not to be displaced within the leg receptors 442. Specifically, the restrictor legs 432 are formed so as to be deflected in the thickness direction from the side wall 431 and are inserted through the leg receptors 442 while being slightly deflected radially inwardly. The restrictor legs 432 each recover from the deflection at the position where the insertion through the corresponding leg receptors 442 is completed, and the outer circumferential surfaces of the restrictor legs 432 abut the inner circumferential surfaces of the leg receptors 442. This prevents the restrictor 43 from shaking against the substrate 44A. In this embodiment, three restrictor legs 432 are provided so that the restrictor legs 432 adjacent to one another are at equal intervals.

The side wall 431 and the end wall 433 of the restrictor 43 define an area in which the detector body 411 is housed. The restrictor 43 houses the detector body 411 by covering the detector body 411, with the end wall 433 being located on the upper side.

The side wall 431 is formed into a cylindrical shape and is arranged along the lateral surface of the detector body 411. The side wall 431 is formed to have an inner diameter that is slightly larger than the outer diameter of the detector cover 411B and is arranged to have an inner circumferential surface close to the lateral surface of the detector cover 411B. Further, the side wall 431 is formed to have a height larger than the height of the detector cover 411B. The side wall 431 and the detector cover 411B are arranged concentrically with each other.

The end wall 433 has a restrictor opening 433A passing through the end wall 433 in the thickness direction and configured to restrict the inherent detection area R to the set detection area P. The end wall 433 is arranged so that the restrictor opening 433A is opposed to the window 411C of the detector body 411. The restrictor opening 433A is open in the inherent detection area R so as to be narrower than the inherent detection area R (see FIG. 6 to FIG. 9).

The restrictor 43 is fixed to the substrate 44A so that the center of the restrictor opening 433A and the opening center of the window 411C coincide with each other. Further, the restrictor 43 houses the detector body 411 so as to be substantially in tight contact with the detector body 411 in the radial direction.

The restrictor 43 has an area restrictor 43A configured to lead the set detection area P out of the inherent detection area R to the detector opening part 421 of the body 42, and an area blocker 43B configured to block an area other than the set detection area P of the inherent detection area R from the body 42.

In this embodiment, the area restrictor 43A is a part of the end wall 433 and is a part including the restrictor opening 433A. The restrictor opening 433A has an opening area that is substantially the same as or smaller than the opening area of the window 411C. The restrictor opening 433A of this embodiment has a circular shape. The area restrictor 43A restricts the inherent detection area R so that the set detection area P expands upward via the restrictor opening 433A.

The area blocker 43B is a part of the side wall 431 and the end wall 433 of the restrictor 43 excluding the area restrictor 43A. The area blocker 43B is formed of a material that blocks the inherent detection area R. The area blocker 43B of this embodiment is formed of a material that does not transmit infrared rays. The area blocker 43B of this embodiment is formed, for example, of a styrene-acrylonitrile-butadiene copolymerized resin, an acetal resin, a polypropylene resin, or the like.

In the body 42, the detector opening part 421 is formed that is open with its circumferential edge located outside the set detection area P (so as to lead the set detection area P to the outside of the detection device 4 without interference with the set detection area P). The detector opening part 421 leads the set detection area P to the outside so that the set detection area P expands upwardly of the spray device 1. The detector opening part 421 of this embodiment has a circular shape. In this embodiment, the detector opening part 421 is constituted by a cover body 511, which will be described below, and the covering 512. The detector opening part 421 is open near the end edge of the covering 512. The detector opening part 421 will be described in detail later.

The closer 45 is configured to be capable of closing the detector opening part 421. The closer 45 has a closer body 451 that closes the detector opening part 421 and a leg 452 extending downwardly from the end edge of the closer body 451. The closer 45 has waterproof properties so as to prevent the spray material or rainwater from entering the inside of the spray body 5.

The closer body 451 is formed into a circular plate shape having substantially the same area as the opening area of the detector opening part 421. The closer body 451 is formed of a material that transmits infrared rays. The closer body 451 of this embodiment is formed, for example, of a polyethylene resin. The leg 452 has a first leg 452A extending downwardly from the end edge of the closer body 451 and a second leg 452B extending from an end of the first leg 452A toward the closer body 451 side at a spacing from the first leg 452A. The leg 452 is configured to be fitted into between a detector outer wall 512B and an inner wall 511D, which will be described below.

As shown in FIG. 4 and FIG. 5, the spray body 5 houses elements necessary for the spray device 1 such as the storage 2, the spray 3, and the detection device 4. The spray body 5 has the cover 51 housing the spray 3 and the detection device 4, and a container 52 housing the storage 2. The spray body 5 is divided into an upper part and a lower part, namely the cover 51 and the container 52. In this embodiment, the spray body 5 is divided so that the cover 51 is located on the upper side and the container 52 is located on the lower side. The cover 51 and the container 52 are connected to each other by being fitted together.

The cover 51 has the cover body 511 housing the spray 3 and the detection device 4, the covering 512 stacked above the cover body 511, and a pedestal 513 fixed to the inside of the cover body 511.

The cover body 511 has a cylindrical peripheral wall 511A with one end connected to the container 52, and an upper wall 511B expanding radially inwardly from the other end of the peripheral wall 511A and overlapping the covering 512.

The peripheral wall 511A is formed tapered with a diameter decreasing as it extends from the one end to the other end (as it advances upward). The peripheral wall 511A of this embodiment is formed into a cylindrical shape.

The upper wall 511B is a circular plate member formed to substantially cover the other end of the peripheral wall 511A. The upper wall 511B has a base 511C in which an opening configured to lead the set detection area P to the outside is formed, and a cylindrical inner wall 511D projecting upwardly from the end edge of the opening. The inner wall 511D of this embodiment is formed into a cylindrical shape.

The covering 512 is a circular plate member. The covering 512 is fitted into the other end of the cover body 511. The covering 512 is arranged on the outer side of the upper wall 511B. This configuration allows the covering 512 and the upper wall 511B to overlap each other in the vertical direction.

The covering 512 has a base 512A in which a first opening T1 configured to lead the set detection area P to the outside and a second opening T2 through which the spray material is discharged to the outside are formed, the cylindrical detector outer wall 512B projecting downwardly from the end edge of the first opening T1, and a cylindrical spray outer wall 512C projecting downwardly from the end edge of the second opening T2 (see FIG. 4). The detector outer wall 512B is arranged on the outer side of the inner wall 511D of the upper wall 511B along the outer circumference of the inner wall 511D. The detector outer wall 512B is arranged concentrically with the inner wall 511D at a spacing from the inner wall 511D.

In this embodiment, the detection device 4 is incorporated into the spray device 1, and therefore the cover 51 functions as the body 42 of the detection device 4. In this embodiment, the detector opening part 421 is constituted by the base 512A, the detector outer wall 512B, the inner wall 511D, and the base 511C, so as to lead the set detection area P to the outside.

The sealing structure between the closer 45 and the detector opening part 421 is formed by the covering 512 and the cover body 511. Specifically, the closer 45 is pressed into an area formed by the inner wall 511D, the base 511C, and the peripheral wall 511A. Then, the detector outer wall 512B is fitted into a gap formed between the first leg 452A and the second leg 452B of the closer 45. Thereby, the closer 45 is sealed against the detector opening part 421 to prevent the spray material, rainwater, or the like from entering the inside of the spray body 5 and prevent the closer 45 from being detached from the spray body 5.

On the upper surface side of the covering 512, the spray opening 33 (see FIG. 4) and the detector opening part 421 are open. The detector opening 421 part is open near the end edge of the covering 512, and the spray opening 33 is open in an intermediate part between the end edge and the center of the covering 512. The upper surface of the upper wall 511B is inclined so as to be lowered as it advances toward the center.

The pedestal 513 is fixed to the inside of the peripheral wall 511A and forms an area in which the substrate 44A, the power supply 6, and the like are arranged. The substrate 44A is fixed to the pedestal 513. In this embodiment, the substrate 44A is fixed by being screw-fastened to the pedestal 513.

The power supply 6 supplies power to the spray 3 and the detection device 4. The power supply 6 is arranged on the lower side of the substrate 44A. The power supply 6 is housed while straddling the cover 51 and the container 52.

The spray device 1 of this embodiment is described as above. Next, a method for restricting the inherent detection area R to the specific set detection area P in the detection device 4 of the spray device 1 according to this embodiment will be described.

The range of the set detection area P is determined depending on the positional relationship between the detector 41 and the restrictor 43. Specifically, the range of the set detection area P is determined depending on the positional relationship between the window 411C of the detector 41 and the restrictor opening 433A of the restrictor 43. Therefore, the position of the restrictor 43 will be first described.

As shown in FIG. 5, the restrictor 43 is arranged between the detector 41 and the body 42. In this embodiment, the restrictor 43 is arranged so that a distance D1 between the restrictor 43 and the detector 41 is smaller than a distance D2 between the restrictor 43 and the body 42. The restrictor 43 of this embodiment is arranged between the detector body 411 and the covering 512 so that the distance D1 between the end wall 433 and the detector cover 411B is smaller than the distance D2 between the end wall 433 and the base 512A. The restrictor 43 is formed so that the outer diameter of the side wall 431 is smaller than the inner diameter of the inner wall 511D of the upper wall 511B, and is arranged on the lower side of the base 511C of the upper wall 511B.

The set detection area P is set by varying the size relationship between the distance D1 between the restrictor 43 and the detector 41 and the distance D2 between the restrictor 43 and the body 42. That is, the distance D1 and the distance D2 can be made equal to each other, or the distance D1 can be made larger than the distance D2 by changing the height of the side wall 431 to change the height of the end wall 433 between the detector cover 411B and the base 512A.

The range of the set detection area P is also determined depending on the area of the restrictor opening 433A. In this embodiment, the detector 41 has the inherent detection area R expanding radially from the window 411C as the predetermined inherent detection area R. The inherent detection area R is set (narrowed) to a specific range depending on the area of the restrictor opening 433A.

First, the case where the area of the restrictor opening 433A has substantially the same size as the opening area of the window 411C and the restrictor opening 433A and the window 411C are arranged to overlap each other in the vertical direction will be described.

Figure 6:
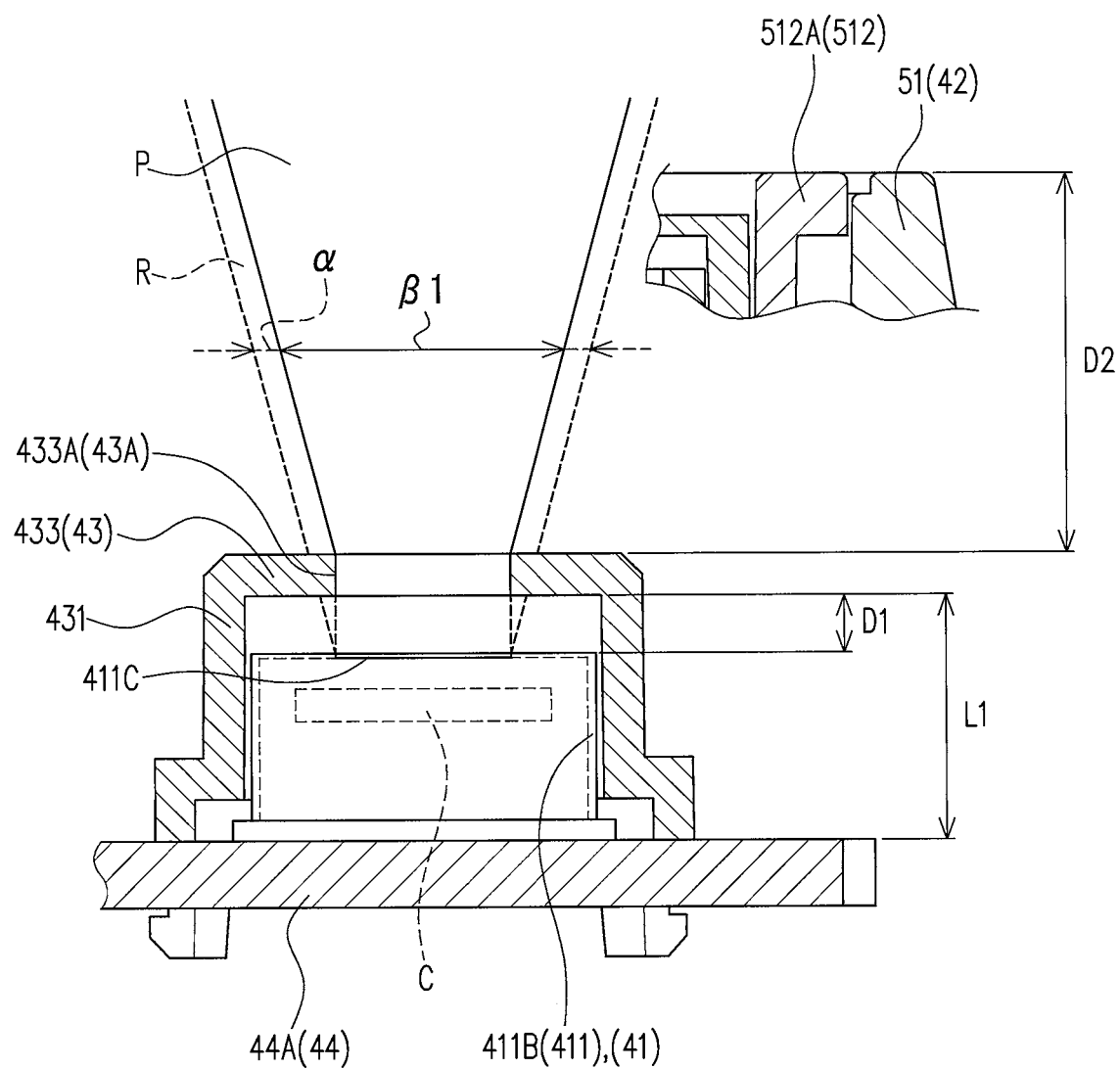
FIG. 6 is a view for explaining a first pattern of setting the set detection area of the spray device according to the aforementioned embodiment.

As shown in FIG. 6, the height of the side wall 431 is set so that the distance D1 is smaller than the distance D2, and the height of the restrictor 43 with reference to the substrate 44A is referred to as L1. In this way, in the case where the restrictor opening 433A and the window 411C are located close to each other, a detection width α is reduced to ß1, and the inherent detection area R can be restricted to the set detection area P.

Figure 7:
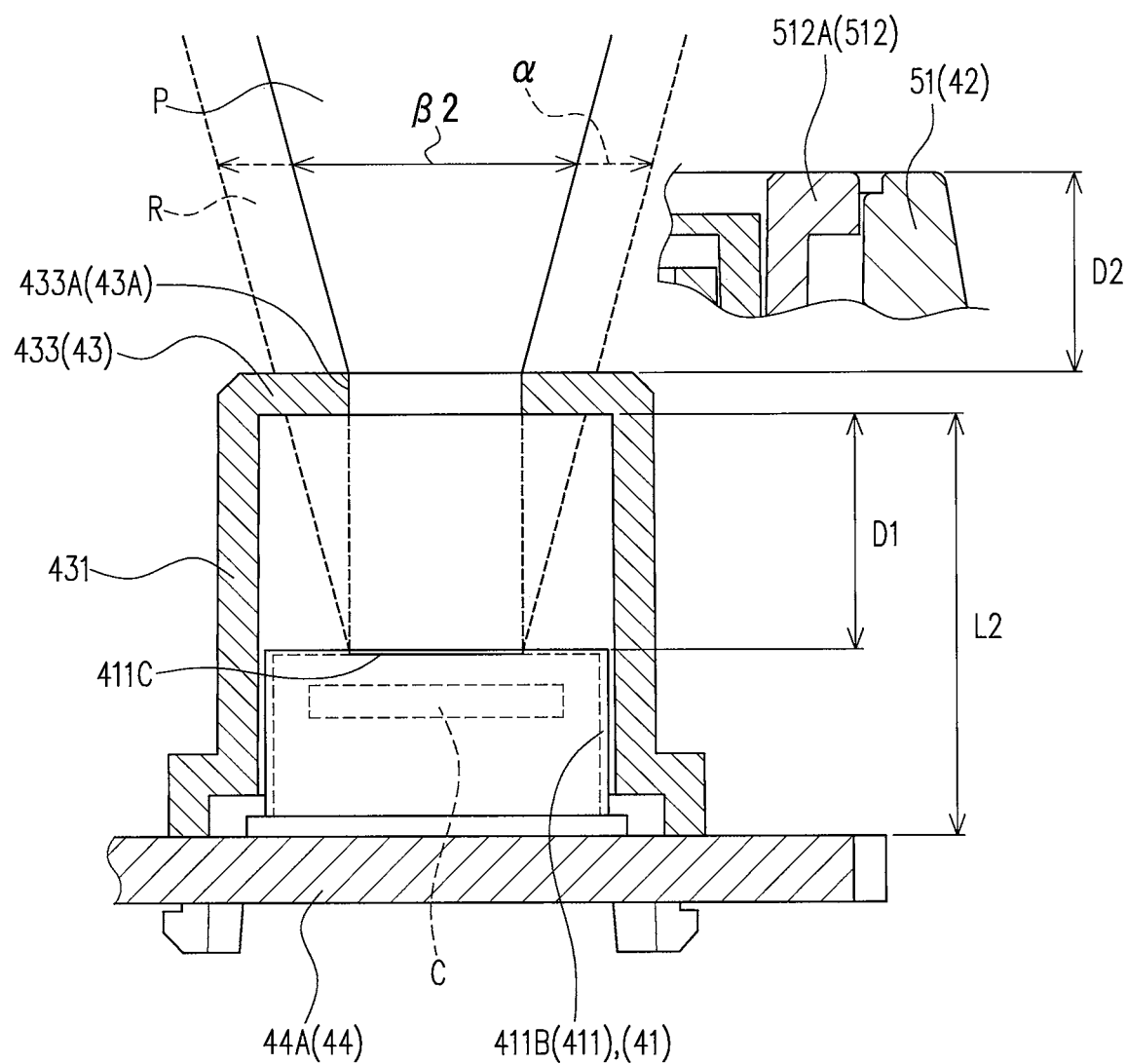
FIG. 7 is a view for explaining a second pattern of setting the set detection area of the spray device according to the aforementioned embodiment.

In contrast, as shown in FIG. 7, the height of the side wall 431 is set so that the distance D1 is larger than the distance D2, and the height of the restrictor 43 with reference to the substrate 44A is referred to as L2 (L1<L2). In this way, in the case where the restrictor opening 433A and the window 411C are located away from each other, the detection width α is reduced to ß2 (ß1>ß2), and the inherent detection area R can be further restricted.

Next, the case where the area of the restrictor opening 433A is smaller than the opening area of the window 411C and the restrictor opening 433A is arranged to be located inside the window 411C will be described.

Figure 8:
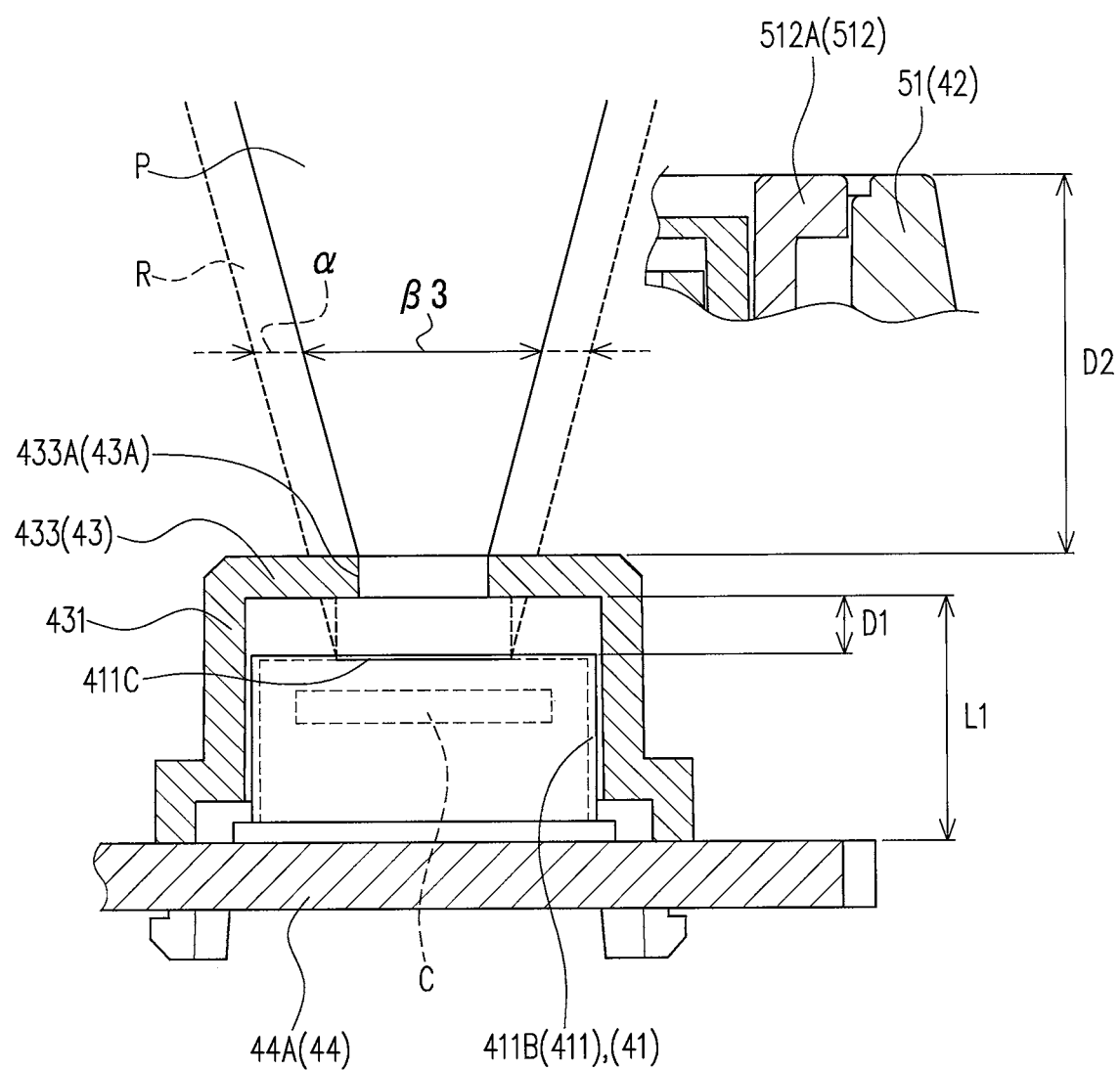
FIG. 8 is a view for explaining a third pattern of setting the set detection area of the spray device according to the aforementioned embodiment.

As shown in FIG. 8, the height of the side wall 431 is set so that the distance D1 is smaller than the distance D2, and the height of the restrictor 43 with reference to the substrate 44A is referred to as L1. In this way, in the case where the restrictor opening 433A and the window 411C are located close to each other, the detection width α is reduced to ß3, and the inherent detection area R can be restricted to the set detection area P. In this case, even if the restrictor 43 has the same height L1, the restrictor opening 433A having a smaller area can make the set detection area P smaller (ß1>ß3).

Figure 9:
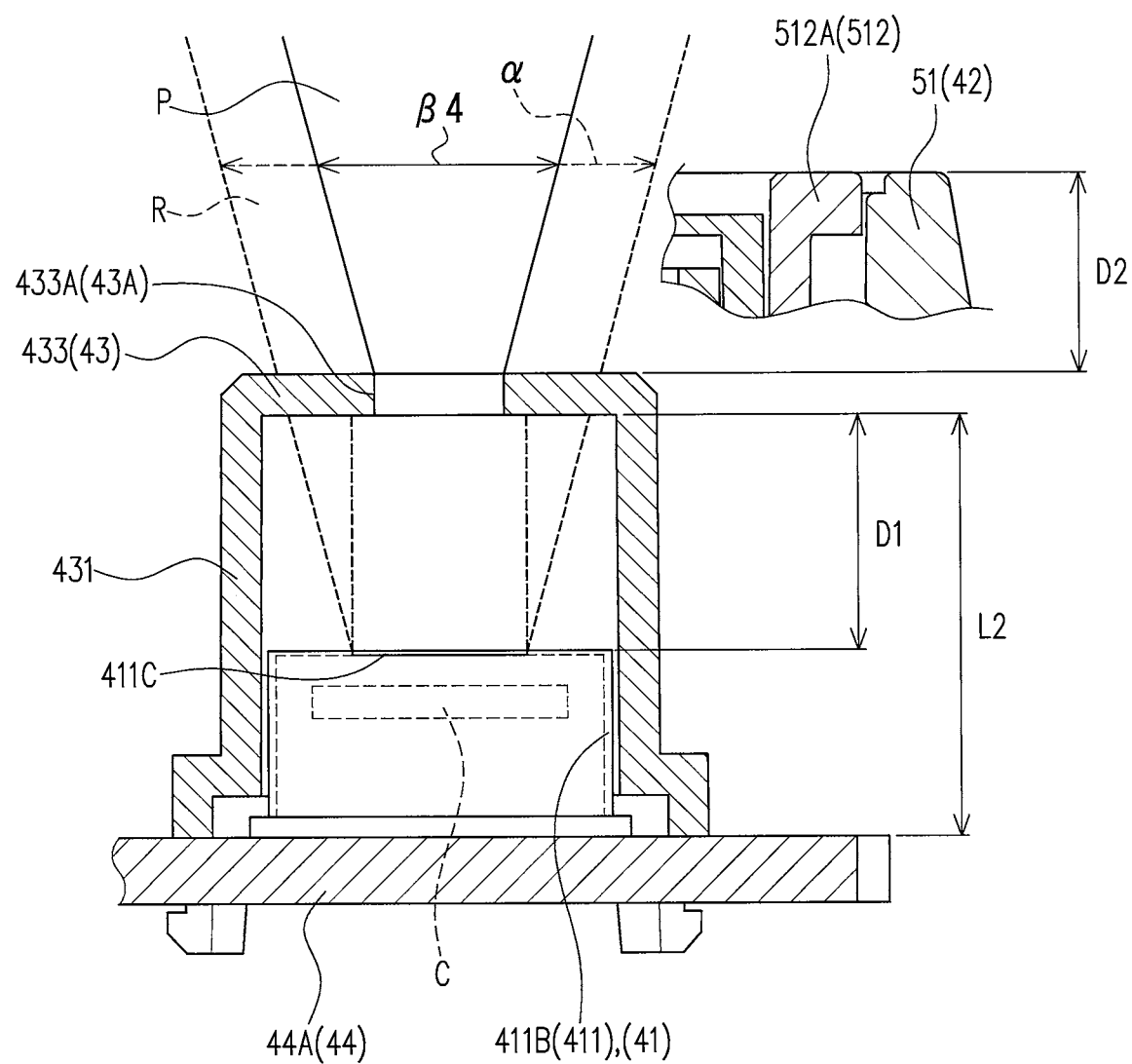
FIG. 9 is a view for explaining a fourth pattern of setting the set detection area of the spray device according to the aforementioned embodiment.

In contrast, as shown in FIG. 9, the height of the side wall 431 is set so that the distance D1 is larger than the distance D2, and the height of the restrictor 43 with reference to the substrate 44A is referred to as L2 (L1<L2). In this way, in the case where the restrictor opening 433A and the window 411C are located away from each other, the detection width α is reduced to ß4 (ß3>ß4), and the inherent detection area R can be further restricted. Further, in this case, even if the restrictor 43 has the same height L2, the restrictor opening 433A having a smaller area can make the set detection area P smaller (ß2>ß4).

As described above, the restrictor 43 is arranged so that the end wall 433 is located between the detector cover 411B and the base 512A. Further, the restrictor 43 is formed so that the area of the restrictor opening 433A is substantially the same as or smaller than the opening area of the window 411C. Thereby, the inherent detection area R can be restricted to the set detection area P as desired.

The substrate 44A to which the detector 41 and the restrictor 43 are fixed is fixed to the pedestal 513 so that the set detection area P is located inside the circumferential edge of the detector opening part 421 in the state where the inherent detection area R is restricted to the set detection area P. Specifically, the substrate 44A is fixed to the pedestal 513 so that the set detection area P is located inside the inner circumference of the inner wall 511D. This prevents the set detection area P from being reduced by the circumferential edge of the detector opening part 421. In this embodiment, the substrate 44A and the inner wall 511D are positioned so that the center line of the restrictor 43 and the center line of the inner wall 511D substantially coincide with each other. At that time, the substrate 44A and the inner wall 511D may be positioned in consideration of the margin of error during installation in which the substrate 44A is fixed to the pedestal 513. Further, the set detection area P may be set so that the set detection area P is located inside the circumferential edge of the detector opening part 421. In this way, the configuration that can absorb the margin of error during installation of the substrate 44A to the pedestal 513 may be employed in advance.

As described above, the spray device 1 according to this embodiment is configured to spray a spray material at a specific time interval and includes: a controller configured to control a spraying operation; a storage 2 configured to store the spray material; a spray 3 configured to spray the spray material; and the detection device 4 described above, wherein the controller performs control so that a spraying operation is stopped when the detection device 4 detects a detection target M. According to such a configuration, the set detection area P is set to a specific range, and therefore the detection target M that should be detected can be detected, and detection of the detection target M that is unnecessary to be detected can be prevented. Accordingly, the spraying operation is stopped when the spraying operation should stop, so that exposure of the detection target M to the spray material can be prevented, whereas the spraying operation is continued when the spraying operation should be performed, so that the spray effect can be sustained. Thus, according to the spray device 1 configured as above, malfunctions can be prevented, and the spraying operation can be suitably performed depending on the surrounding situation.

In this embodiment, the detection device 4 includes: a detector 41 having an inherent detection area R and configured to detect entry of a detection target M into the inherent detection area R; a restrictor 43 configured to restrict the inherent detection area R to a specific set detection area P; a body 42 in which a detector opening part 421 is formed; a detector fixer 44 configured to fix the detector 41; and a restrictor fixer 46 of which a position is fixed with respect to the detector fixer 44 and to which the restrictor 43 is fixed, the restrictor fixer 46 being configured so that a relative position between the detector 41 and the restrictor 43 is fixed by fixing a position of the restrictor 43 with respect to the detector fixer 44 via the restrictor fixer 46, wherein the detector 41 and the restrictor 43 of which the positions are fixed with respect to each other via the restrictor fixer 46 are assembled to the body 42 so that a circumferential edge of the detector opening part 421 of the body 42 is located outside the set detection area P while the restriction of the inherent detection area R by the restrictor 43 is maintained.

According to such a configuration, the restrictor 43 is fixed to the restrictor fixer 46 of which the position is fixed with respect to the detector fixer 44 to which the detector 41 is fixed, and therefore the position of the restrictor 43 is fixed with respect to the detector 41 via the restrictor fixer 46. Thus, the restrictor 43 is positioned and fixed to the detector 41 in the state of being arranged at a specific position for restricting the inherent detection area R. In this way, according to such a configuration, the restrictor 43 can be accurately positioned with respect to the inherent detection area R of the detector 41, and therefore the set detection area P can be set accurately (without variation).

In this embodiment, the restrictor fixer 46 is provided in at least one of the detector 41 and the detector fixer 44. According to such a configuration, the restrictor fixer 46 is provided in at least one of the detector 41 itself and the detector fixer 44 to which the detector 41 is fixed, and therefore the restrictor 43 can be handled integrally with the detector 41 and the detector fixer 44. Thus, the detector 41, the detector fixer 44, and the restrictor 43 can be easily installed in the body 42 in the state where the inherent detection area R is restricted to the set detection area P.

In this embodiment, the restrictor has an area restrictor 43A configured to lead the set detection area P out of the inherent detection area R to the detector opening part 421 of the body 42, and an area blocker 43B configured to block an area other than the set detection area P of the inherent detection area R from the body 42. According to such a configuration, the set detection area P out of the inherent detection area R can be led to the detector opening part 421 of the body 42 so as to be led to the outside of the detection device 4 via the detector opening part 421, and the area other than the set detection area P of the inherent detection area R can be blocked from the body 42. Therefore, the restricted area other than the set detection area P can be prevented from being led to the outside via the detector opening part 421, and the set detection area P can be accurately led to the outside of the detection device 4.

In this case, the area restrictor 43A has the restrictor opening 433A that is open in the inherent detection area R to be smaller than the inherent detection area R. According to such a configuration, the restrictor opening 433A is open in the inherent detection area R to be smaller than the inherent detection area R, and therefore the inherent detection area R can be restricted to the set detection area P via the opening. Specifically, the restrictor opening 433A can make the inherent detection area R small, the inherent detection area R having a larger area than the area of the restrictor opening 433A on the detector 41 side, depending on the area of the restrictor opening 433A on the body 42 side. Therefore, the inherent detection area R can be easily restricted to the set detection area P only by adjusting the area of the restrictor opening 433A.

In this embodiment, the detector 41 is a pyroelectric sensor. According to such a configuration, the detector 41 can detect objects emitting infrared rays such as a person preferentially. Therefore, the detector 41 can detect the detection target M accurately, when used for the purpose of detecting entry of a person or the like.

In the aforementioned embodiment, the area blocker 43B is formed by a material that blocks the inherent detection area R. Therefore, the area other than the set detection area P restricted by the area restrictor 43A can be prevented from being led to the outside. This can prevent the detection target M from being improperly detected and the spraying from being improperly stopped.

In the aforementioned embodiment, the side wall 431 is arranged along the lateral surface of the detector body 411 so that the inner circumferential surface thereof is located close to the lateral surface of the detector body 411. Therefore, the detector 41 is less likely to be displaced inside the restrictor 43, and thus the set detection area P is less likely to vary.

In the aforementioned embodiment, the spray opening 33 and the detector opening part 421 are open on the covering 512. Therefore, the spray material is sprayed upwardly of the spray device 1, and the set detection area P expands upwardly of the spray device 1. Thereby, when the spray device 1 is installed on the ground for use, exposure of a person or the like coming close to the spray device 1 from the lateral side to the spray material can be suppressed, and the spraying can be effectively performed upwardly of the spray device 1.

In the aforementioned embodiment, the upper surface of the covering 512 is inclined so as to be lowered as it advances toward the center. Further, the detector opening part 421 is open near the end edge of the covering 512. Therefore, even if the spray material, rainwater, or the like is showered on the spray device 1, the spray material, rainwater, or the like can be collected at the center of the covering 512, and the spray material, rainwater, or the like is less likely to enter the inside of the spray device 1 via the detector opening part 421.

In the aforementioned embodiment, the detector opening part 421 is open near the end edge of the covering 512, and the spray opening 33 is open in an intermediate part between the end edge and the center of the covering 512. Therefore, also in the case of using the spray device 1 in a place where a person or the like comes close to the spray device 1 only from a specific direction such as in a place near the wall side, the spray effect can be exerted effectively. Specifically, since the detector opening part 421 is open near the end edge of the covering 512, the set detection area P can be expanded laterally of the spray device 1 when the spray device 1 is installed so that the detector opening part 421 is located facing a direction in which the person or the like comes close thereto, as a result of which the person or the like is easily detected. Further, since the spray opening 33 is open in an intermediate part between the end edge and the center of the covering 512, the spray device 1 can perform the spraying inside the end edge of the covering 512, and a reduction in spray amount due to the spray material being blocked by a wall or the like can be prevented.

In the aforementioned embodiment, the detection device 4 can restrict the inherent detection area R to the specific set detection area P. Therefore, use of the detection device 4 can prevent variation in detection performance (accuracy) for each product that occurs due to the set detection area P varying depending on the product.

In the aforementioned embodiment, the cover 51 is closed by the double structure of the upper wall 511B of the cover body 511 and the covering 512. This makes it difficult for the spray material, rainwater, surrounding foreign matter, or the like, to enter the inside of the cover 51.

As described above, this embodiment can provide the detection device 4 capable of performing detection with high accuracy (without variation) by accurately setting the detection area, and the spray device 1 including the detection device 4.

It is, of course, that the spray device 1 of the present invention is not limited to the aforementioned embodiment, and various modifications can be made without departing from the gist of the present invention.

In the aforementioned embodiment, the spray device 1 including the detection device 4 is described, but it is needless to say that the detection device 4 can be used alone. That is, the detection device 4 can be installed in anything that operates by detecting an object or the like, other than the spray device 1.

Figure 10:
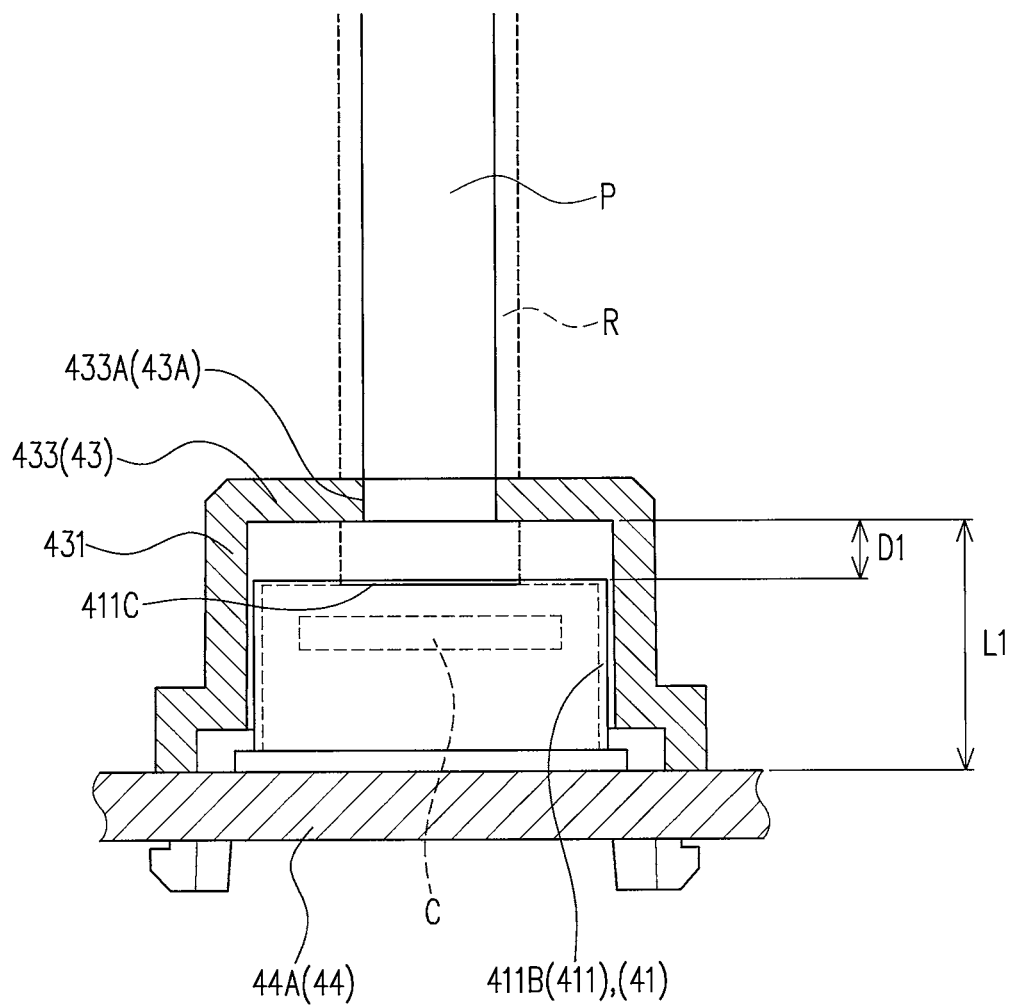
FIG. 10 is a view for explaining a pattern of setting the set detection area of a detector having another inherent detection area.

The aforementioned embodiment was described by taking, for example, the case where the detector body 411 forms the inherent detection area R radially in the specific direction from the window 411C, without limitation thereto. The detector body 411 may form the inherent detection area R radially in the radial direction, without limiting to the specific direction, with the detector body 411 at the center. Further, the detector body 411 does not necessarily form the inherent detection area R radially, and may form the inherent detection area R so as to maintain a specific width, as shown in FIG. 10.

In the aforementioned embodiment, a liquid drug having an insecticidal effect is used as the spray material, without limitation thereto. The spray device 1 can be used also for applications for reducing bacteria such as sterilization and disinfection, applications for imparting fragrance such as aromas and deodorants, and any other application that uses the spray material by atomizing it.

The aforementioned embodiment was described by taking, for example, the case where the detector 41 is arranged in the spray body 5 so that the set detection area P expands upwardly, but the expanding direction of the set detection area P is not limited. The detector 41 may be arranged in the spray body 5 so that the set detection area P expands laterally of the spray device 1. Further, the detector 41 may be arranged in the spray body 5 so that the set detection area P expands downwardly of the spray device 1. In this way, the spray device 1 can be installed and the spray effect can be exerted, depending on the spray material to be used (depending on the purpose of the spraying).

Figure 11:
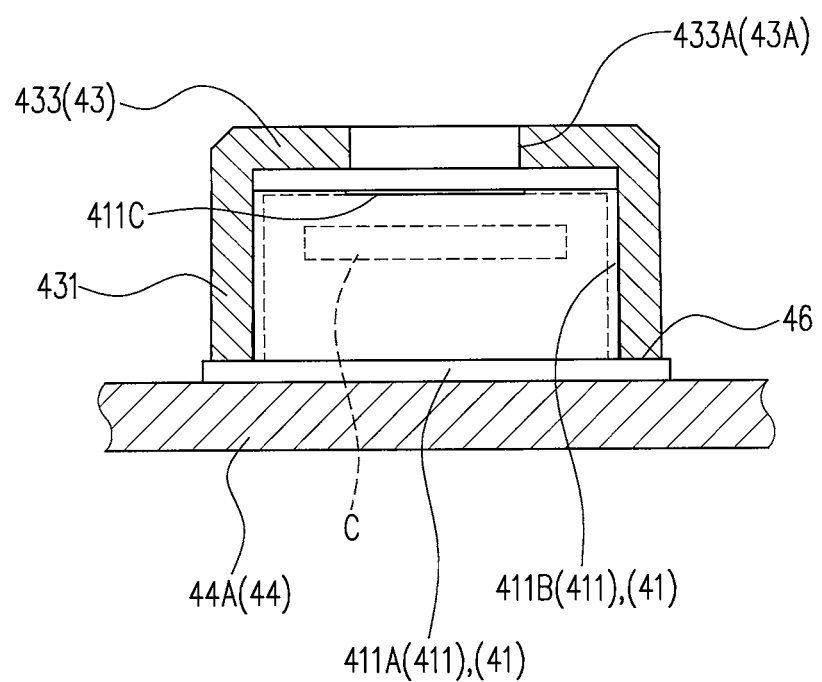
FIG. 11 is a view for explaining the state where a restrictor of a spray device according to another embodiment is fixed to a detector.

The aforementioned embodiment was described by taking, for example, the case where the restrictor 43 is fixed to the substrate 44A, without limitation thereto. As shown in FIG. 11, the restrictor 43 may be directly fixed to the detector 41, for example, by being bonded to the circumferential edge of the mount 411A, the detector cover 411B, or the like of the detector 41. Since the position of a part of the detector 41 such as the circumferential edge of the mount 411A or the detector cover 411B is fixed with respect to the substrate 44A, the circumferential edge of the mount 411A or the detector cover 411B serves as the restrictor fixer 46 in this case. This allows the detector 41 and the substrate 44A to be integrated with each other and can prevent the variation of the set detection area P as well.

Figure 12:
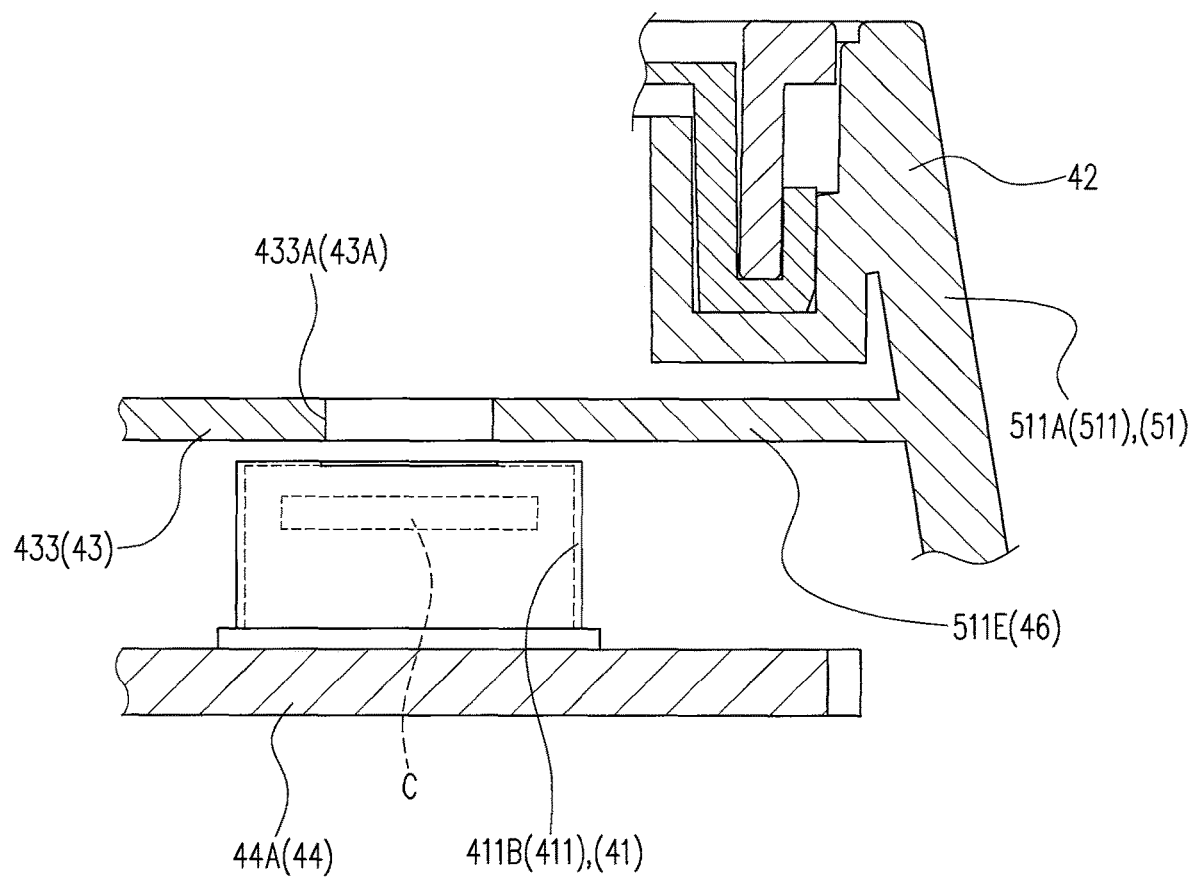
FIG. 12 is a view for explaining the state where a restrictor of a spray device according to another embodiment is fixed to an extension.

Further, as shown in FIG. 12, the restrictor 43 may be fixed to an extension 511E extending radially inwardly from the cover 51 of which the position is fixed with respect to the substrate 44A. That is, since the position of the extension 511E is fixed with respect to the substrate 44A, the extension 511E serves as the restrictor fixer 46 in this case. In short, the restrictor 43 needs only to be fixed to a member of which the position is fixed with respect to the substrate 44A, while being arranged between the detector 41 and the body 42 in order to restrict the inherent detection area R to the set detection area P.

The aforementioned embodiment did not particularly mention the timing at which the spray device 1 stops spraying, but the spray device 1 may be controlled not to spray when the detection device 4 detects the detection target M, or controlled to stop spraying when the detection device 4 detects the detection target M during the spraying.

The aforementioned embodiment was described by taking, for example, the case where the detection device 4 is provided in the spray device 1 that is controlled to stop spraying upon the detection of the detection target M, without limitation thereto. The detection device 4 may be provided in the spray device 1 that is controlled to start spraying upon the detection of the detection target M. For example, in the case where an aromatic or the like that is preferably sprayed when the detection target M comes close thereto is used as the spray material, the detection device 4 may be provided in an aromatic device that starts spraying upon the detection of the detection target M.

Figure 13:
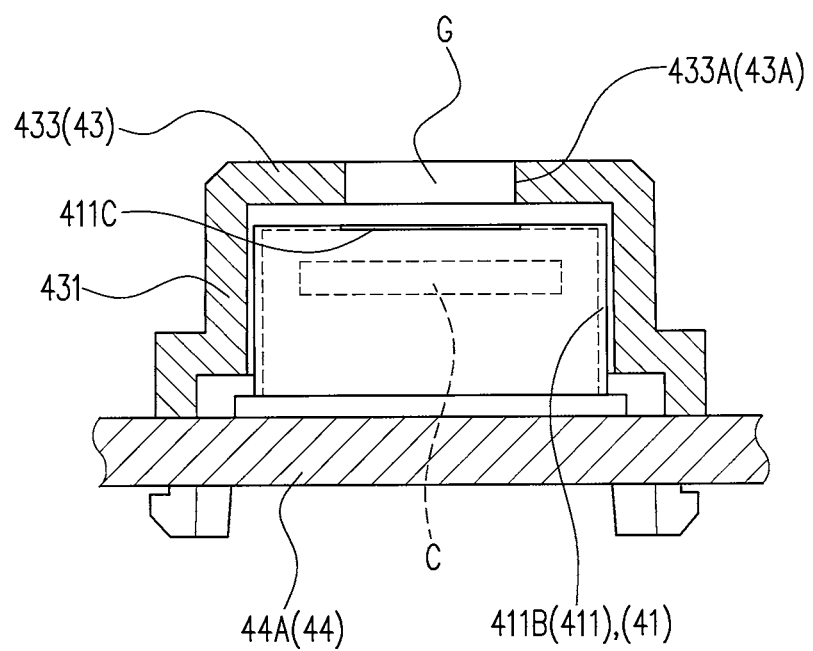
FIG. 13 is a view for explaining the case where a Fresnel lens is provided as an area restrictor of a spray device according to another embodiment.
Figure 14:
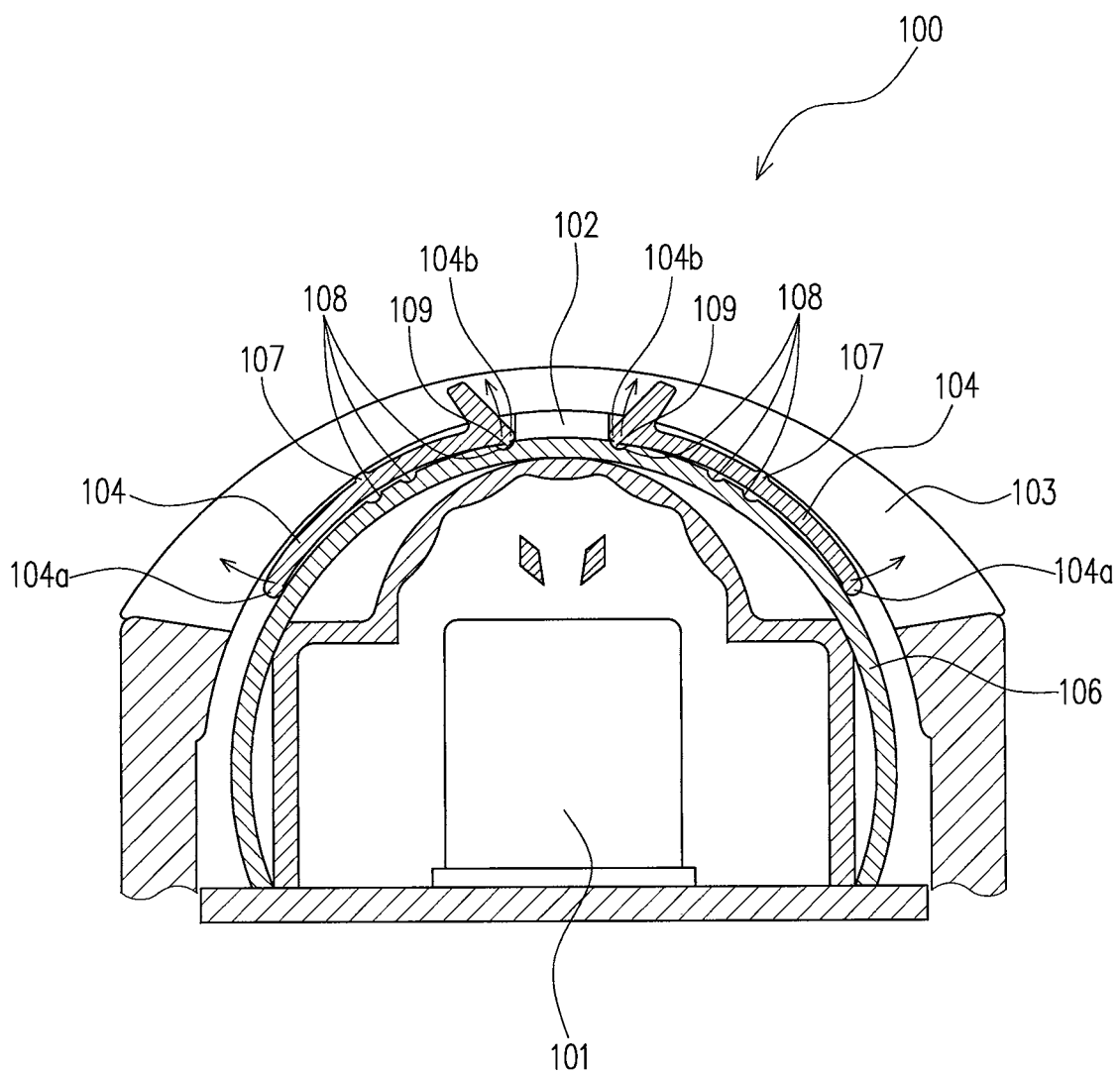
FIG. 14 is a conventional heat ray sensor-equipped automatic switch.

The aforementioned embodiment was described by taking, for example, the case where the inherent detection area R is restricted to the set detection area P by the restrictor opening 433A, without limitation thereto. The area restrictor 43A may be a lens G arranged in the inherent detection area R and configured to restrict the inherent detection area R. This enables the size of the set detection area P to be set freely by designing the lens. For example, as shown in FIG. 13, the area restrictor 43A may be configured to restrict the inherent detection area R by arranging the lens G that is designed to achieve the desired set detection area P in the restrictor opening 433A. Further, the lens G may be directly installed at the other end of the side wall 431 without being arranged in the restrictor opening 433A. For example, a Fresnel lens may be employed as the lens G.

The aforementioned embodiment was described by taking, for example, the case where the inherent detection area R is restricted to the set detection area P by the width of the inherent detection area R being reduced, without limitation thereto. The inherent detection area R may be restricted to the set detection area P by varying the detection angle. For example, the case where the restrictor opening 433A has a circular shape with a diameter of 1 cm, and the distance D1 between the restrictor 43 and the detector 41 is varied (that is, the height of the side wall 431 is changed) will be described.

Suppose that the detector 41 forming the inherent detection area R with a detection angle of 70 degrees is used as the detector 41. When the distance D1 between the restrictor 43 and the detector 41 is set to 0.5 cm below the restrictor opening 433A having a circular shape with a diameter of 1 cm, the restrictor opening 433A can allow a detection angle of the set detection area P up to a maximum of 90 degrees. Therefore, in the case of using the detector 41, the set detection area P has a detection angle of 70 degrees (the detection angle of the inherent detection area R), but the detection angle can be reduced by increase in the distance D1 between the restrictor 43 and the detector 41. For example, when the distance D1 between the restrictor 43 and the detector 41 is set to 1 cm, the detection angle of the set detection area P is 54 degrees, where the detection angle can be reduced from that of the inherent detection area R by 16 degrees. When the distance D1 between the restrictor 43 and the detector 41 is set to 2 cm, the detection angle of the set detection area P is 28 degrees, where the detection angle can be reduced from that of the inherent detection area R by 42 degrees. When the distance D1 between the restrictor 43 and the detector 41 is set to 3 cm, the detection angle of the set detection area P is 18 degrees, where the detection angle can be reduced from that of the inherent detection area R by 52 degrees. In this way, the detection angle of the set detection area P can be freely set by varying the distance D1 between the restrictor 43 and the detector 41. Further, it is also possible to reduce the width of the inherent detection area R or vary the detection angle by using the lens G.

The aforementioned embodiment was described by taking, for example, the case where the one detection device 4 is provided, but a plurality of detection devices 4 may be provided in various devices, including the spray device 1, for which the detection device 4 can be employed. Further, the set detection area P may be formed by the plurality of detection devices 4.

The aforementioned embodiment was described by taking, for example, the case where the area of the restrictor opening 433A is substantially the same as or smaller than the opening area of the window 411C, without limitation thereto. The restrictor opening 433A needs only to be smaller than the inherent detection area R, and may be larger than the opening area of the window 411C.

Although not particularly mentioned in the aforementioned embodiment, the restrictor 43 may be provided with a clearance hole separately from the restrictor opening 433A. This configuration can allow gases inside the restrictor 43 to be released to the outside via the clearance hole, even if the temperature of the detector 41 increases, and thus can prevent abnormal fluctuations in temperature of the detector 41. The clearance hole is preferably provided on the side wall 431 in order to accurately set the set detection area P.

Although not particularly mentioned in the aforementioned embodiment, the spray device 1 may include a display configured to display information on the spraying operation. The display may be configured, for example, to display information on the time to the next spraying operation.

This embodiment was described by taking, for example, the case where the spray device 1 is controlled to perform spraying for 0.1 second to 2 seconds every 30 seconds, without limitation thereto. The interval and duration for the spraying operation are not limited and can be changed depending on the usage situation.

REFERENCE SIGNS LIST

1: Spray device
2: Storage
3: Spray
33: Spray opening
4: Detection device
41: Detector
42: Body
43: Restrictor
43A: Area restrictor
43B: Area blocker
44: Detector fixer
45: Closer
46: Restrictor fixer
411: Detector body
411A: Mount
411B: Detector cover
411C: Window
412: Terminal
421: Detector opening part
431: Side wall
432: Restrictor leg
432A: Claw
433: End wall
433A: Restrictor opening
441: Terminal receptor
442: Leg receptors
451: Closer body
452: Leg
452A: First leg
452B: Second leg
5: Spray body
51: Cover
52: Container
511: Cover body
511A: Peripheral wall
511B: Upper wall
511C: Base
511D: Inner wall
511E: Extension
512: Covering
512A: Base
512B: Detector outer wall
512C: Spray outer wall
513: Pedestal
6: Power supply
C: Pyroelectric element
D1, D2: Distance
G: Lens
M: Detection target
P: Set detection area
Q: Spray area
R: Inherent detection area T1: First opening (opening area)
T2: Second opening
α, ß1, ß2, ß3, ß4: Detection width

The invention claimed is:

1. A detection device comprising:
a detector having an inherent detection area and configured to detect entry of a detection target into the inherent detection area;
a restrictor configured to restrict the inherent detection area to a specific set detection area;
a body in which a detector opening part is formed;
a detector fixer configured to fix the detector; and
a restrictor fixer of which a position is fixed with respect to the detector fixer and to which the restrictor is fixed, the restrictor fixer being configured so that a relative position between the detector and the restrictor is fixed by fixing a position of the restrictor with respect to the detector fixer via the restrictor fixer, wherein
the detector comprises:
a light receiving element; and
a detector body inside which the light receiving element is arranged, the detector body including a detector cover in which a window facing a light receiving surface of the light receiving element is formed,
the restrictor comprises an end wall located between the body and the detector cover, and
opposed to the detector cover with a clearance therebetween, the end wall having a restrictor opening that is open to be smaller than the inherent detection area, the restrictor opening has an opening area that is set to be smaller than an opening area of the window, and
the detector and the restrictor of which the positions are fixed with respect to each other via the restrictor fixer are assembled to the body so that a circumferential edge of the detector opening part of the body is located outside the set detection area while a restriction of the inherent detection area by the restrictor is maintained.

2. The detection device according to claim 1, wherein the restrictor fixer is provided in at least one of the detector and the detector fixer.

3. The detection device according to claim 1, wherein the restrictor comprises an area blocker configured to block an area other than the set detection area of the inherent detection area from the body.

4. The detection device according to claim 1, wherein the detector is a pyroelectric sensor.

5. A spray device configured to spray a spray material at a specific time interval, the spray device comprising:
a controller configured to control a spraying operation;
a storage configured to store the spray material;
a sprayer configured to spray the spray material; and
the detection device according to claim 1, wherein
the controller performs control so that spraying is stopped when the detection device detects a detection target.

* * * * *